(12) United States Patent
Ye et al.

(10) Patent No.: US 10,410,729 B2
(45) Date of Patent: Sep. 10, 2019

(54) DEVICE, SYSTEM, AND METHOD FOR REDUCING PROGRAM DISTURB IN MULTIPLE-TIME PROGRAMMABLE CELL ARRAY

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Xiao Ye, Shanghai (CN); Bongkil Kim, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 1 day.

(21) Appl. No.: 15/902,957

(22) Filed: Feb. 22, 2018

(65) Prior Publication Data

US 2018/0315485 A1    Nov. 1, 2018

(30) Foreign Application Priority Data

Apr. 26, 2017    (CN) .......................... 2017 1 0279686

(51) Int. Cl.
*G11C 16/34*    (2006.01)
*G11C 11/56*    (2006.01)
(Continued)

(52) U.S. Cl.
CPC ...... *G11C 16/3427* (2013.01); *G11C 11/5628* (2013.01); *G11C 16/0433* (2013.01);
(Continued)

(58) Field of Classification Search
CPC . G11C 16/3427; G11C 16/0433; G11C 16/10; G11C 11/5628; H01L 27/11519; H01L 27/11521
See application file for complete search history.

(56) References Cited

U.S. PATENT DOCUMENTS 9,368,215 B2 * 6/2016 La Rosa ................ G11C 16/10
2004/0027856 A1 * 2/2004 Lee ..................... G11C 16/0408
365/185.11
(Continued)

*Primary Examiner* — Vu A Le
*Assistant Examiner* — Sung Il Cho
(74) *Attorney, Agent, or Firm* — Kilpatrick Townsend & Stockton LLP

(57) ABSTRACT

A flash memory cell array includes multiple flash memory units. A flash memory unit includes first and second select transistors, and first and second floating-gate transistors on a substrate. The first floating-gate transistor has a source connected to a drain of the first select transistor, and a drain connected to a drain of the second floating-gate transistor. The second floating-gate transistor has a source connected a drain of the second select transistor. The first and second floating-gate transistors of a flash memory unit in a j-th column have a control gate connected to a j-th word line. The first and second select transistors of the flash memory unit in the j-th column have a source connected to a common source line. The first and second floating-gate transistors of a flash memory unit in an i-th row have a drain connected to an i-th bit line.

21 Claims, 7 Drawing Sheets

(51) Int. Cl.
  *H01L 27/11521* (2017.01)
  *G11C 16/10* (2006.01)
  *H01L 27/11519* (2017.01)
  *G11C 16/04* (2006.01)

(52) U.S. Cl.
  CPC ........ *G11C 16/10* (2013.01); *H01L 27/11519* (2013.01); *H01L 27/11521* (2013.01)

(56) References Cited

U.S. PATENT DOCUMENTS

| | | | |
|---|---|---|---|
| 2004/0252558 A1* | 12/2004 | Umezawa | G11O 5/147 365/189.11 |
| 2005/0083744 A1* | 4/2005 | Arai | G11C 16/0433 365/202 |
| 2006/0083064 A1* | 4/2006 | Edahiro | G11C 7/12 365/185.17 |
| 2006/0083066 A1* | 4/2006 | Hasegawa | G11C 16/0425 365/185.18 |
| 2006/0083072 A1* | 4/2006 | Umezawa | G11C 16/12 365/185.29 |
| 2006/0083091 A1* | 4/2006 | Edahiro | G11C 7/12 365/203 |
| 2007/0296017 A1* | 12/2007 | Mawatari | H01L 27/0207 257/314 |
| 2009/0114951 A1* | 5/2009 | Lojek | G11C 16/0433 257/202 |
| 2015/0117109 A1* | 4/2015 | La Rosa | G11C 16/0425 365/185.18 |
| 2015/0117117 A1* | 4/2015 | La Rosa | H01L 21/28273 365/185.29 |
| 2015/0236031 A1* | 8/2015 | Mantelli | H01L 27/11524 365/185.28 |
| 2016/0141032 A1* | 5/2016 | Tailliet | G11C 16/0483 365/185.05 |
| 2016/0181265 A1* | 6/2016 | Regnier | H01L 29/7881 365/185.29 |
| 2017/0103813 A1* | 4/2017 | Wang | G11C 16/0408 |
| 2017/0169075 A1* | 6/2017 | Jiang | G06F 3/061 |

* cited by examiner

DEVICE, SYSTEM, AND METHOD FOR REDUCING PROGRAM DISTURB IN MULTIPLE-TIME PROGRAMMABLE CELL ARRAY

CROSS-REFERENCES TO RELATED APPLICATIONS

The present application claims priority to Chinese patent application No. 201710279686.6, filed with the State Intellectual Property Office of People's Republic of China on Apr. 26, 2017, the content of which is incorporated herein by reference in its entirety.

FIELD OF THE INVENTION

The present application relates to flash memory technology, and more particularly to an array of multiple-time programmable memory cells, a semiconductor memory device including the same, a method of manufacturing the same, and a method of operating thereof.

BACKGROUND OF THE INVENTION

Matured Technology Enhancement (MTE) can improve gate density and is compatible with logic processes. Therefore, MTE is used in storage device processes to increase the density of memory devices.

Current MTE-based multiple-time programmable (MTP) flash memory cell arrays have following problems: When performing a programming operation to program data into a floating-gate transistor, program disturb may occur to floating-gate transistors on the same page or on different pages and affect the endurance performance of memory devices.

BRIEF SUMMARY OF THE INVENTION

Embodiments of the present application provide a novel array of multiple-time programmable flash memory cell units and methods of operating a MTP flash memory cell array that can reduce program disturb.

In one aspect of the present disclosure, A multiple-time programmable (MTP) flash memory cell array comprising m column(s) by n row(s) (m×n) MTP flash memory cell units, m and n being integer, m≥1, and n≥1. Each of the MTP flash memory cell units includes a first select transistor, a second select transistor, a first floating-gate transistor, and a second floating-gate transistor disposed on a substrate. The first floating-gate transistor has a source connected to a drain of the first select transistor, and a drain connected to a drain of the second floating-gate transistor, and the second floating transistor has a source connected a drain of the second select transistor. The MTP flash memory cell array includes the first floating-gate transistor and the second floating-gate transistor of an MTP flash memory cell unit in a j-th column each having a control gate connected to a j-th word line, 1≤j≤m; the first select transistor and the second select transistor of each of the MTP flash memory cell units in the j-th column each having a source connected to a common source line; and the first floating-gate transistor and the second floating-gate transistor of an MTP flash memory cell unit in an i-th row each having a drain connected to an i-th bit line, 1≤i≤n.

In one embodiment, each of the MTP flash memory cell units includes the first floating-gate transistor has a control gate and a floating gate below the control gate, the control gate and the floating-gate of the first floating-gate transistor are not aligned with each other; the second floating-gate transistor has a control gate and a floating gate below the control gate, and the control gate and the floating gate of the second floating-gate transistor are not aligned with each other.

In one embodiment, the MTP flash memory cell array further includes a control circuit configured to provide programming operation conditions to the first floating-gate transistor of an MTP flash memory cell unit in the i-th row and j-th column of the MTP flash memory cell array, the control circuit is further configured to apply a voltage –Vcc2 to the i-th bit line; a voltage Vcc1 to a gate of the first select transistor of the MTP flash memory cell unit in the i-th row and j-th column of the MTP flash memory cell array; a voltage 0V-VPP to the j-th word line; and a voltage Vcc2 to the common source line and the substrate, wherein 0V<Vcc1<Vcc2<VPP.

In one embodiment, the control circuit is further configured to apply the voltage Vcc2 to other bit lines except the i-th bit line; the voltage Vcc1 to gates of the first select transistors in the j-th column of MTP flash memory cell units except the gate of the first select transistor in the i-th row.

In one embodiment, the control circuit is further configured to apply the voltage Vcc2 to a gate of the second select transistor in the i-th row and j-th column of an MTP flash memory cell unit.

In one embodiment, the control circuit is further configured to apply the voltage Vcc2 to other bit lines except the i-th bit line; the voltage Vcc2 to gates of the second select transistors in the j-th column of MTP flash memory cell units except a gate of the second select transistor in the i-th row.

In one embodiment, the MTP flash memory cell array further includes a control circuit configured to provide programming operation conditions to the second floating-gate transistor of an MTP flash memory cell unit in the i-th row and j-th column of the MTP flash memory cell array, the control circuit is further configured to apply a voltage –Vcc2 to the ith-bit line; a voltage Vcc1 to a gate of the second select transistor of the MTP flash memory cell unit in the i-th row and j-th column of the MTP flash memory cell array; a voltage 0V-VPP to the j-th word line; and a voltage Vcc2 to the common source line and the substrate, wherein 0V<Vcc1<Vcc2<VPP.

In one embodiment, the control circuit is further configured to apply the voltage Vcc2 to other bit lines except the i-th bit line, the voltage Vcc1 to gates of the second select transistors in the j-th column of MTP flash memory cell units except a gate of the second select transistor in the i-th row.

In one embodiment, the control circuit is further configured to apply the voltage Vcc2 to a gate of the first select transistor in the i-th row and j-th column of an MTP flash memory cell unit.

In one embodiment, the control circuit is further configured to apply the voltage Vcc2 to other bit lines except the i-th bit line; the voltage Vcc2 to gates of the first select transistors in the j-th column of MTP flash memory cell units except a gate of the first select transistor in the i-th row.

In one embodiment, the control circuit is further configured to apply the voltage Vcc2 to gates of the first select transistors and second select transistors in the i-th row of MTP flash memory unit cell units except a gate of the first select transistor and a gate of the second select transistor in the j-th column of MTP flash memory unit cells; a voltage 0V to other word lines except the j-th word line.

In one embodiment, the control circuit is further configured to apply the voltage Vcc2 to bit lines except the i-th bit line; the voltage Vcc2 to gates of the first select transistors and the gates of the second select transistors of MTP flash memory cell units except a gate of the first select transistor and a gate of the second select transistor of the MTP flash memory cell unit in the i-th row and j-th column of the MTP flash memory cell array; and a voltage 0V to word lines except the j-th word line.

In one embodiment, the control circuit is further configured to gradually increase the voltage 0V-VPP from 0V to a voltage VPP1, wherein VPP1≤VPP.

Embodiments of the present invention also provide a memory device that includes the above-described multiple-time programmable (MTP) flash memory cell array.

In another aspect of the present disclosure, a method for operating a multiple-time programmable (MTP) flash memory cell array including m×n MTP flash memory cell units, m and n are integer, and m≥1, and n≥1. Each of the MTP flash memory cell unit includes a first select transistor, a second select transistor, a first floating-gate transistor, and a second floating-gate transistor disposed on a substrate, wherein the first floating-gate transistor has a source connected to a drain of the first select transistor, and a drain connected to a drain of the second floating-gate transistor, the second floating-gate transistor has a source connected a drain of the second select transistor. The MTP flash memory cell array includes the first floating-gate transistor and the second floating-gate transistor of an MTP flash memory cell in a j-th column, each of the first and second floating-gate transistors has a control gate connected to a j-th word line, 1≤j≤m, each of the first select transistor and the second select transistor of the MTP flash memory cell unit in the j-th column has a source connected to a common source line, the first floating-gate transistor and the second floating-gate transistor of an MTP flash memory cell unit in an i-th row each have a drain connected to an i-th bit line, 1≤i≤n. The method includes applying a voltage −Vcc2 to an i-th bit line; applying a voltage Vcc1 to a gate of the first select transistor of the MTP flash memory cell unit in the i-th row and j-th column of the MTP flash memory cell array; applying a voltage 0V-VPP to the j-th word line; and applying a voltage Vcc2 to the common source line and the substrate, wherein 0V<Vcc1<Vcc2<VPP.

In one embodiment, the method further includes applying the voltage Vcc2 to other bit lines except the i-th bit line; applying the voltage Vcc1 to gates of the first select transistors in the j-th column of MTP flash memory cell units except a gate of the first select transistor in the i-th row.

In one embodiment, the method further includes applying the voltage Vcc2 to a gate of the second select transistor in the i-th row and j-th column of an MTP flash memory cell unit.

In one embodiment, the method further includes applying the voltage Vcc2 to other bit lines except the i-th bit line; applying the voltage Vcc2 to gates of the second select transistors in the j-th column of MTP flash memory cell units except a gate of the second select transistor in the i-th row.

In one embodiment, the method further includes applying the voltage Vcc2 to gates of the first select transistors and second select transistors in the i-th row of MTP flash memory unit cells except the gate of the first select transistor and the gate of the second select transistor in the j-th column of MTP flash memory unit cells; applying a voltage 0V to other word lines except the j-th word line.

In one embodiment, the method further includes applying the voltage Vcc2 to other bit lines except the i-th bit line; applying the voltage Vcc2 to gates of the first select transistors and the gates of the second select transistors of MTP flash memory cell units except a gate of the first select transistor and a gate of the second select transistor in the i-th row and j-th column of an MTP flash memory unit cell; applying a voltage 0V to other word lines except the j-th word line.

In one embodiment, applying the voltage 0V-VPP to the j-th word line includes gradually increasing the voltage 0V-VPP from 0V to a voltage VPP1, VPP1≤VPP.

In yet another aspect of the present disclosure, a method for operating a multiple-time programmable (MTP) flash memory cell array comprising m×n MTP flash memory cell units, m and n are integer, m≥1, and n≥1. Each of the MTP flash memory cell unit includes a first select transistor, a second select transistor, a first floating-gate transistor, and a second floating-gate transistor on a substrate. The first floating-gate transistor has a source connected to a drain of the first select transistor, and a drain connected to a drain of the second floating-gate transistor, the second floating transistor has a source connected a source of the second select transistor. The MTP flash memory cell array includes the first floating-gate transistor and the second floating-gate transistor of an MTP flash memory cell in a j-th column each having a control gate connected to a j-th word line, 1≤j≤m, the first select transistor and the second select transistor of the MTP flash memory cell in the j-th column each having a source connected to a common source line, the first floating-gate transistor and the second floating-gate transistor of an MTP flash memory cell unit in an i-th row each having a drain connected to an i-th bit line, 1≤i≤n. The method includes applying a voltage −Vcc2 to an i-th bit line; applying a voltage Vcc1 to a gate of the second select transistor of the MTP flash memory cell unit in the i-th row and j-th column of the MTP flash memory cell array; applying a voltage 0V-VPP to the j-th word line; and applying a voltage Vcc2 to the common source line and the substrate, wherein 0V<Vcc1<Vcc2<VPP.

In one embodiment, the method further includes applying the voltage Vcc2 to other bit lines except the i-th bit line; applying the voltage Vcc1 to gates of the second select transistors in the j-th column of MTP flash memory cell units except a gate of the second select transistor in the i-th row.

In one embodiment, the method further includes applying the voltage Vcc2 to a gate of the first select transistor in the i-th row and j-th column of an MTP flash memory cell unit.

In one embodiment, the method further includes applying the voltage Vcc2 to other bit lines except the i-th bit line; applying the voltage Vcc2 to gates of the first select transistors in the j-th column of MTP flash memory cell units except a gate of the first select transistor in the i-th row.

In one embodiment, the method further includes applying the voltage Vcc2 to gates of the first select transistors and second select transistors in the i-th row of MTP flash memory unit cells except the gate of the first select transistor and the gate of the second select transistor in the j-th column of MTP flash memory unit cells; applying a voltage 0V to other word lines except the j-th word line.

In one embodiment, the method further includes applying the voltage Vcc2 to other bit lines except the i-th bit line; applying the voltage Vcc2 to gates of the first select transistors and the gates of the second select transistors of MTP flash memory cell units except a gate of the first select transistor and a gate of the second select transistor in the i-th row and j-th column of an MTP flash memory unit cell; applying a voltage 0V to other word lines except the j-th word line.

In one embodiment, applying the voltage 0V-VPP to the j-th word line includes gradually increasing the voltage 0V-VPP from 0V to the voltage VPP1, VPP1≤VPP The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

Figure 1:
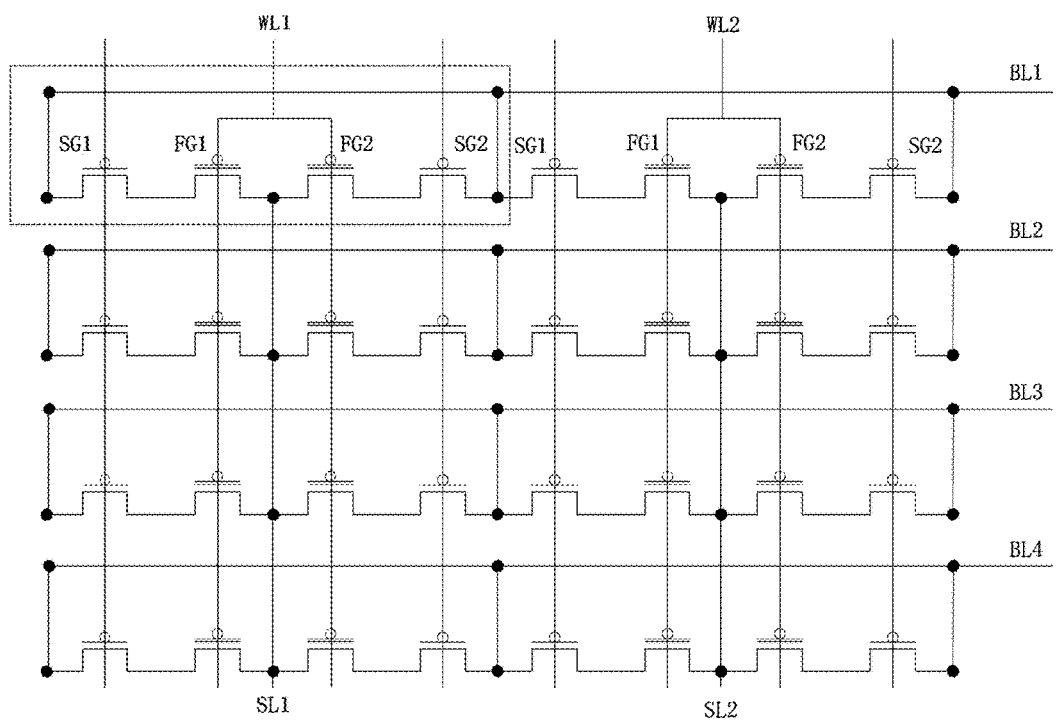
FIG. 1 is a schematic diagram of a multiple-time programmable (MTP) flash memory cell array, as known in the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present disclosure will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

FIG. 1 is a schematic diagram of a conventional multiple-time programmable (MTP) flash memory cell array, as known in the prior art. As shown within the dotted lines of FIG. 1, a MTP flash memory cell unit includes two select transistors SG1 and SG2, and two floating-gate transistors FG1 and FG2 disposed between the two select transistors SG1 and SG2.

The MTP flash memory cell array shown in FIG. 1 includes 2 columns by 4 rows of MTP flash memory cell units. The select transistors SG1 and SG2 of the MTP flash memory cell units in the first row each have a source connected to a bit line BL1. The select transistors SG1 and SG2 of the MTP flash memory cell units in the second row each have a source connected to a bit line BL2. The select transistors SG1 and SG2 of the MTP flash memory cell units in the third row each have a source connected to a bit line BL3, and the select transistors SG1 and SG2 of the MTP flash memory cell units in the fourth row each have a source connected to a bit line BL4. The floating-gate transistors FG1 and FG2 of the MTP flash memory cell units in the first column each have a gate connected to a word line WL1. The floating-gate transistors FG1 and FG2 of the MTP flash memory cell units in the second column each have a gate connected to a word line WL2. The floating-gate transistors FG1 and FG2 of the MTP flash memory cell units in the first column each have a drain connected to a source line SL1. The floating-gate transistors FG1 and FG2 of the MTP flash memory cell units in the second column each have a drain connected to a source line SL2. Both source lines SL1 and SL2 are connected to a common source line.

Figure 2:
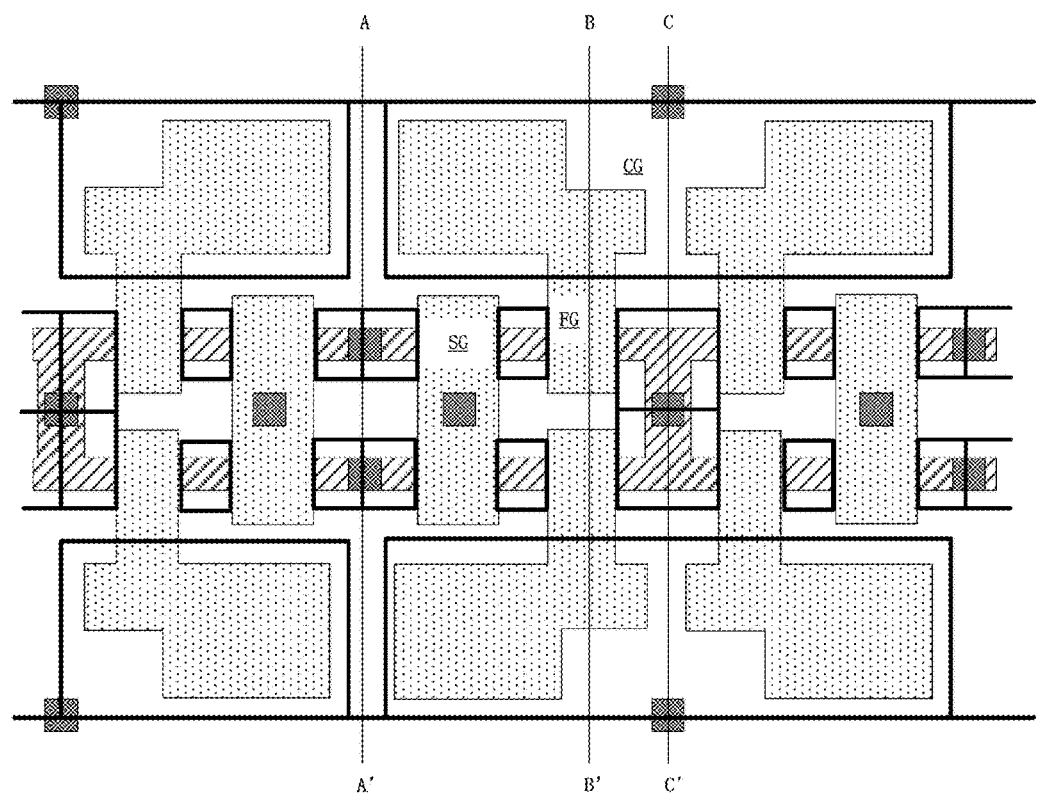
FIG. 2 is a layout of the MTP flash memory cell array of FIG. 1.

FIG. 2 is a layout of the MTP flash memory cell array of FIG. 1. The line AA' indicates the location of a bit line BL, the line BB' indicates the location of a floating-gate and a control gate, and the line CC' indicates the location of a source line SL.

Figure 3A:
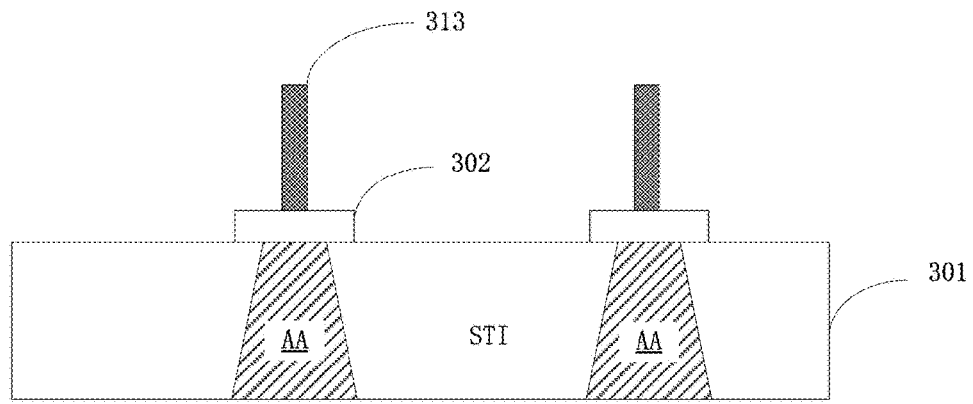
FIG. 3A is a cross-sectional view illustrating the structure of FIG. 2 taken along the line AA'.

FIG. 3A is a cross-sectional view illustrating the structure of FIG. 2 taken along the line AA'. As shown in FIG. 3A, a substrate 301 has active regions AAs, each is associated with a bit line BL, a shallow trench isolation (STI) structure separates adjacent active regions AAs. A polysilicon 302 is disposed on the active regions AAs, and a contact 313 is disposed on polysilicon 302.

Figure 3B:
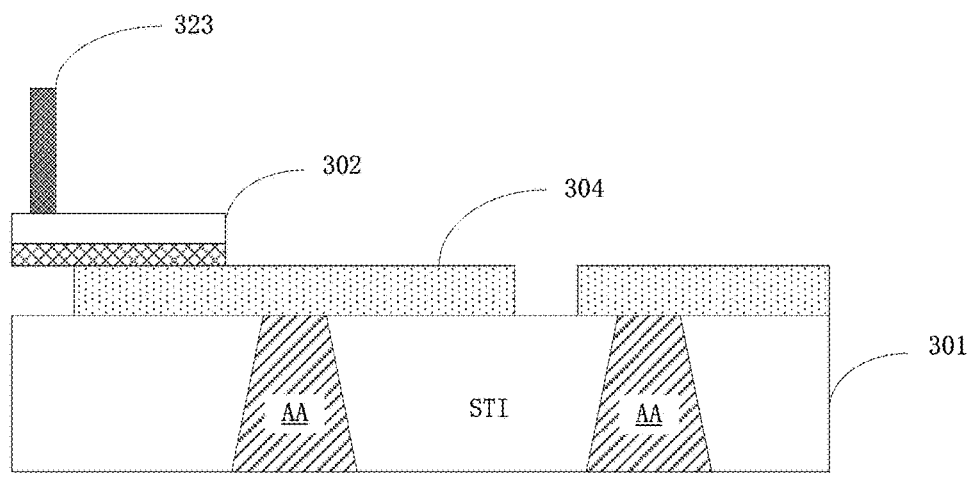
FIG. 3B is a cross-sectional view illustrating the structure of FIG. 2 taken along the line BB'.

FIG. 3B is a cross-sectional view illustrating the structure of FIG. 2 taken along the line BB'. As shown in FIG. 3B, substrate 301 has active region AAs, each of the active regions includes a polysilicon layer 304 (serving as a floating gate), a polysilicon layer 302 (serving as a control gate) on polysilicon layer 304, and a contact 323 on polysilicon layer 302.

Figure 3C:
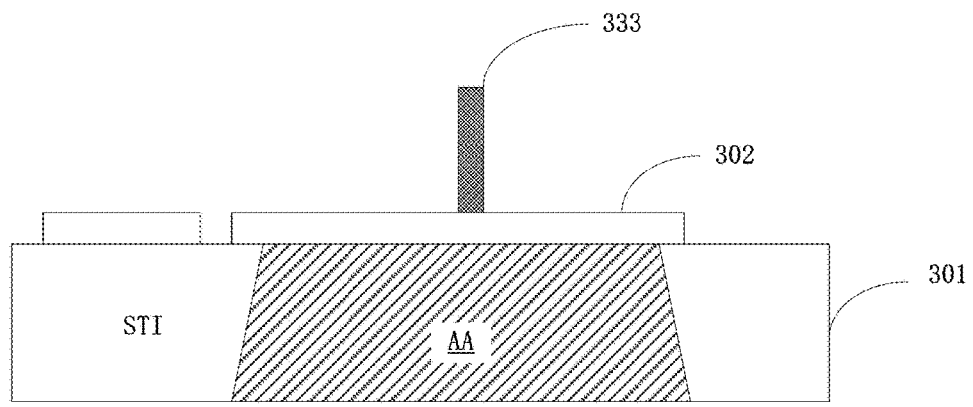
FIG. 3C is a cross-sectional view illustrating the structure of FIG. 2 taken along the line CC'.

FIG. 3C is a cross-sectional view illustrating the structure of FIG. 2 taken along the line CC'. As shown in FIG. 3C, substrate 301 has an active region AA associated with the source line SL, polysilicon layer 302 is disposed on the active region AA and the STI, and a contact 333 on a portion of polysilicon layer 302 on the active region AA.

When a programming operation is performed on a floating-gate transistor (e.g., the floating transistor FG1 of the first row and the first column of the MTP flash memory cell unit), the programming operation conditions are performed as follows:

(1) applying a voltage Vcc2 to BL1, applying a voltage 0V to BL2, BL3, and BL4;

(2) applying a voltage Vcc1 to the gate of SG1 in the first column, applying the voltage Vcc2 to the gate of SG2 in the first column, and to the gates of SG1 and SG2 in the second column;

(3) applying a voltage of 0-VPP to the word line WL1, and applying the voltage 0V to the word line WL2;

(4) applying the voltage Vcc2 to the common source line (i.e., SL1, SL2);

(5) applying the voltage Vcc2 to the substrate.

Under the above programming operation conditions, the programming of the floating-gate transistor FG1 can be achieved. However, the above programming operation conditions can cause program disturb to other floating-gate transistors. The program disturb analysis is described below:

First, it is not desirable to program the FG2 in the first row and first column and the FG1 and FG2 in the first column and second and third rows of the MTP flash memory cell units. However, because the difference between the voltage 0-VPP (i.e., the voltage applied to WL1) and the voltage −Vcc2 applied to the corresponding drain (i.e., the voltage applied to SL1) is relatively large, therefore, electrons may be pulled into the floating gates of the FG1s and FG2s, thereby programming these floating gate of the FG2 in the first row and first column and the floating gates of the FG1s and FG2s in the first column and second and third rows of the MTP flash memory cell units.

Second, it is not desirable to program the FG1s and FG2s in the second column of the MTP flash memory cell units. However, because of the relatively large difference between the voltage Vcc2 applied to BL1 and the voltage −Vcc2 applied to SL2, electrons may be pulled into the floating gates, thereby programming these floating-gate transistors.

Third, for the FG1s and FG2s in the second column of the MTP flash memory cell units, because the difference between the voltage 0V applied to BL3 and BL4 and the voltage —Vcc2 applied to SL2 is relatively large, electrons may be pulled into the floating gates, thereby programming these floating-gate transistors FG1s and FG2s in the second column of the MTP flash memory cell units.

Based on the above analysis, program disturb may occur to conventional MTP flash memory cell arrays.

The inventors of the present disclosure thus propose a novel array of MTP flash memory cell units and adjustment to the programming operation conditions for the array, such that while programming a certain floating-gate transistor, undesired program disturb to other floating-gate transistors can be reduced.

Figure 4:
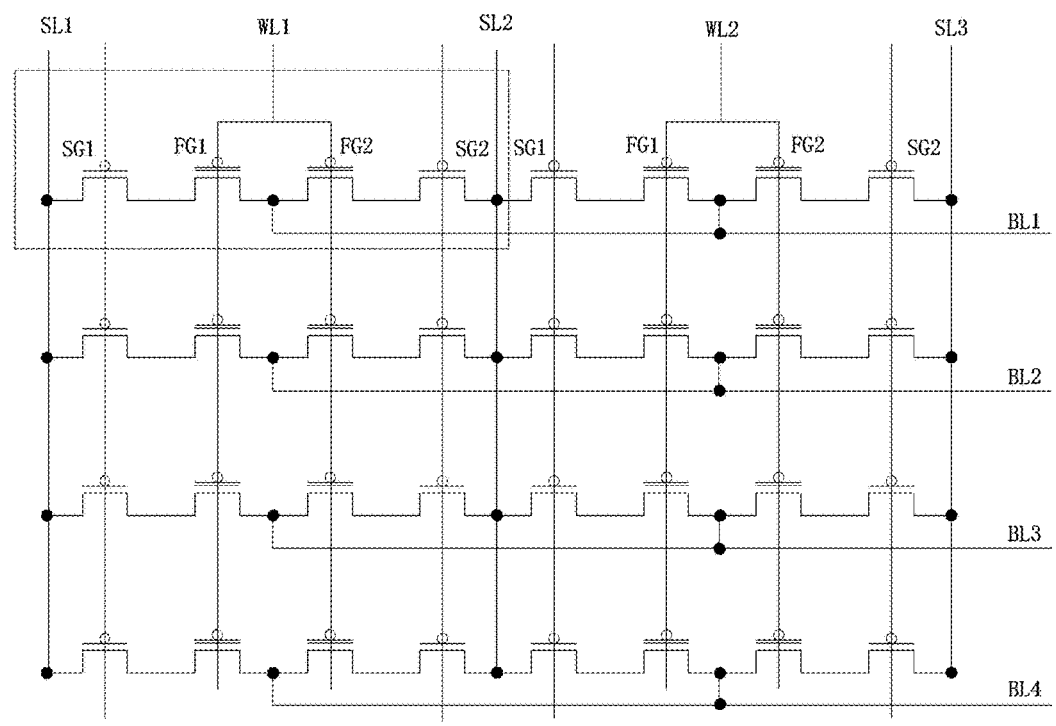
FIG. 4 is a schematic circuit diagram of a multiple-time programmable (MTP) flash memory cell array according to an embodiment of the present disclosure.

FIG. 4 is a schematic diagram of a multiple-time programmable (MTP) flash memory cell array according to an embodiment of the present disclosure. The MTP flash memory cell array may include m column by n rows of MTP flash memory cell units, where m≥1 and n≥1 and m and n are integer. FIG. 4 shows an example embodiment of an array including 2 columns by 4 rows of MTP flash memory cell units.

As shown within the dotted lines of FIG. 4, a MTP flash memory cell unit includes a first select gate transistor (referred to as SG1 hereinafter), a second select gate transistor (referred to as SG2 hereinafter), a first floating-gate transistor (referred to as FG1 hereinafter), and a second floating-gate transistor (referred to as FG2 hereinafter) on a substrate. The first and second floating-gate transistors FG1 and FG2 are disposed between the first and second select gate transistors SG1 and SG2. The substrate may be a silicon substrate and includes an active region, e.g., an N-well. In one embodiment, SG1 and SG2 may be PMOS transistors.

FG1 has a source connected to a drain of SG1, and a drain connected to a drain of FG2. FG2 has a source connected to a drain of SG2.

A control gate of FG1s and a control gate of FG2s in the j-th column of the MTP flash memory cell units are connected to the j-th word line, where 1≤j≤m. For example, the control gate of FG1s and the control gate of FG2s in the first column of the MTP flash memory cell units are connected to the first word line WL1, the control gate of FG1s and the control gate of FG2s in the second column of the MTP flash memory cell unit are connected to the second word line WL2.

A source of SG1s and a source of SG2s are connected to a common source line. In one embodiment, the sources of SG1s in the j-th column of the MTP flash memory cell units are connected to a first source line SL1, the sources of SG2s in the j-th column of the MTP flash memory cell units are connected to a second source line SL2, and all source lines SLs (e.g., SL1, SL2, and SL3) are connected to a same common source line (not shown). In addition, the sources of SG1s and SG2s in two adjacent MTP flash memory cell units of the same row may be connected to a same source line SL. For example, the source of SG2 in the first row and first column of the MTP flash memory cell unit and the source of SG1 in the first row and second column of the MTP flash memory cell unit are connected to the source line SL2.

A drain of FG1 in the i-th row of the MTP flash memory cell unit is connected to the i-th bit line, where 1≤i≤n. For example, the drains of FG1s in the first row of the MTP flash memory cell units are connected to the first bit line BL1, the drains of FG1s in the second row of the MTP flash memory cell units are connected to the second bit line BL2, the drains of FG1s in the third row of the MTP flash memory cell units are connected to the third bit line BL3, and the drains of FG1s in the fourth row of the MTP flash memory cell units are connected to the fourth bit line BL4.

In the MTP flash memory cell array of the embodiment according to the present disclosure, all of the sources of select gate transistors SG1s and all of the sources of select gate transistors SG2 are connected to a common source line, all of the drains of the floating-gate transistors FG1s in the i-th row of the MTP flash memory cell units are connected to the i-th bit line. Comparing with conventional MTP flash memory cell arrays of the prior art, the MTP flash memory cell array of the embodiment of the present disclosure can reduce program disturb to other floating-gate transistors FG1 and FG2 when performing a programming operation on a specific FG1 or FG2.

Figure 5:
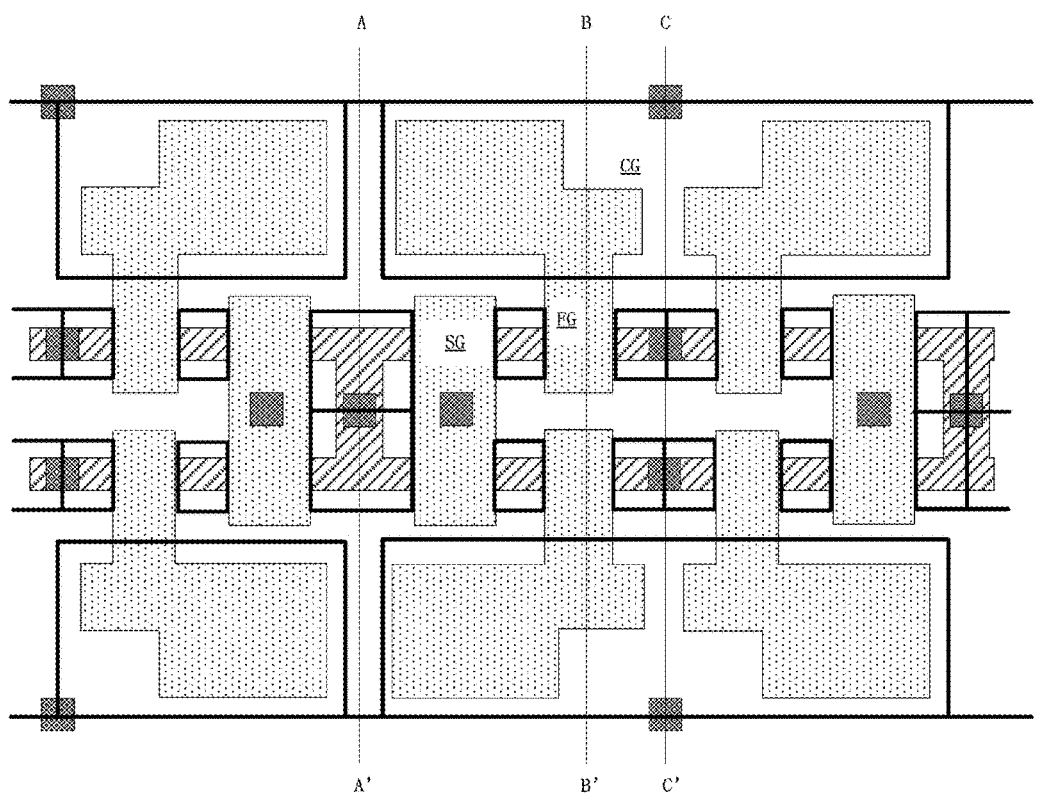
FIG. 5 is a layout of the MTP flash memory cell array of FIG. 4 according to an embodiment of the present disclosure.

FIG. 5 is a layout of the MTP flash memory cell array of FIG. 4 according to an embodiment of the present disclosure. CG denotes a control gate, FG denotes a floating gate, SG denotes a select gate. The line AA' indicates the location of a bit line BL, the line BB' indicates the location of a floating-gate and a control gate, and the line CC' indicates the location of a source line SL.

Figure 6A:
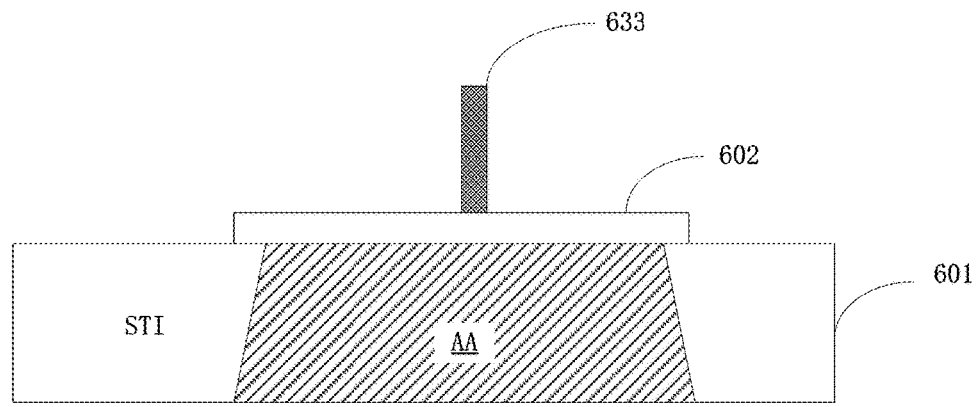
FIG. 6A is a cross-sectional view illustrating the structure of FIG. 5 taken along the line AA'.

FIG. 6A is a cross-sectional view illustrating the structure of FIG. 5 taken along the line AA'. As shown in FIG. 6A, a substrate 601 has an active region AA associated with a source line SL, a shallow trench isolation (STI) structure separates two adjacent active regions AAs, a control gate material layer 602 disposed on the active region AA, and a contact 633 disposed on control gate material layer 602.

Figure 6B:
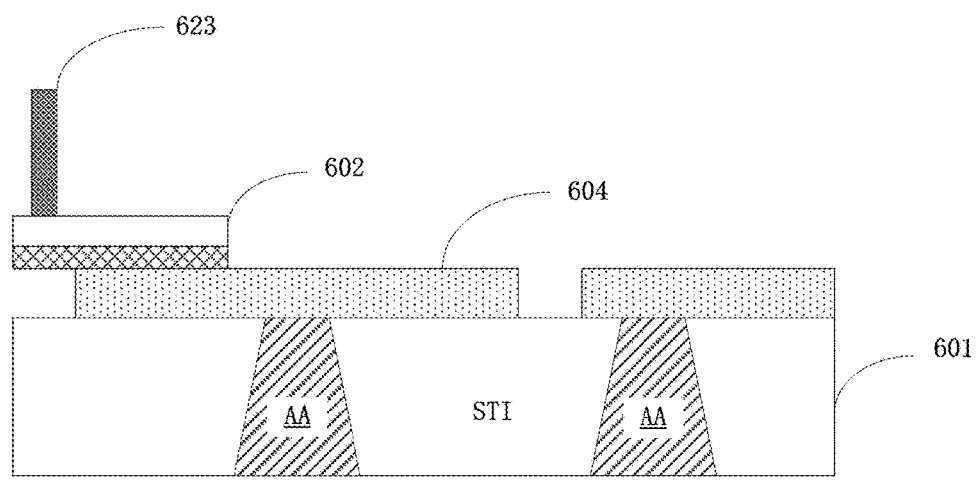
FIG. 6B is a cross-sectional view illustrating the structure of FIG. 5 taken along the line BB'.

FIG. 6B is a cross-sectional view illustrating the structure of FIG. 5 taken along the line BB'. As shown in FIG. 5B, substrate 301 has the active region AA, a floating gate 604 (e.g., polysilicon), a control gate 602 on floating-gate 604, and a contact 623 on control gate 602. An oxide-nitride-oxide (ONO) structure is disposed between control gate 602 and floating-gate 604. Herein, control gate 602 and floating gate 604 are not aligned in the vertical direction, i.e., control gate 602 and floating gate 604 are shifted relative to each other by a portion.

Figure 6C:
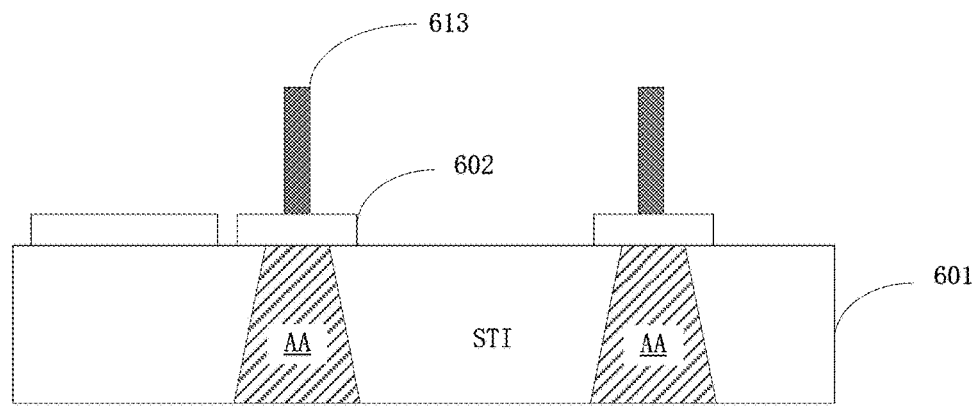
FIG. 6C is a cross-sectional view illustrating the structure of FIG. 5 taken along the line CC'.

FIG. 6C is a cross-sectional view illustrating the structure of FIG. 5 taken along the line CC'. As shown in FIG. 3C, substrate 301 has a plurality of active regions AA associated with the bit line SL, control gate (e.g., polysilicon) 602 may be associated with an active region disposed on the active region AA and the STI, and a contact 613 on a portion of control gate 602 on the active region AA.

The following paragraphs describe application of a voltage applied to a floating-gate transistor (FG1 or FG2) to perform a programming operation.

When a programming operation is performed on a floating-gate transistor (e.g., the floating transistor FG1 in the i-th row and the j-th column of the MTP flash memory cell unit), the programming operation conditions (referred to as the first programming operation conditions hereinafter) are performed as flows:

(1) applying a voltage $-V_{cc2}$ to an i-th bit line;
(2) applying a voltage $V_{cc1}$ to the gate of SG1 in the i-th row and j-th column of the MTP flash memory cell unit;
(3) applying a voltage of (0-VPP) to the j-th word line;
(4) applying a voltage $V_{cc2}$ to the common source line and the substrate, wherein $0V \leq V_{cc1} \leq V_{cc2} \leq VPP$.

In one embodiment, VPP≤6V. In one embodiment, the voltage applied to the j-th word line gradually increases from 0V to VPP1, thereby improving the programming success rate. For example, the voltage applied to the j-th word line is incremented 1V per microsecond (1V/μs), thus the voltage gradually increases from 0V to a certain voltage VPP1 that is smaller than VPP (e.g., 3V) or to VPP (e.g., 6V).

Using the above-described first programming operation conditions, the SG1 in the i-th row and j-th column of the MTP flash memory cell unit is turned on, hot electrons below the FG1 under the action of the electric field will be injected into the floating gate of FG1, in order to realize the programming of the FG1 in the i-th row and j-th column of the MTP flash memory cell unit. The other FG1s and FG2s that are not to be programmed can be controlled by additional programming conditions based on the above-described programming operation conditions. The following will describe the programming operation conditions in detail.

In one embodiment, the voltage $V_{cc2}$ is applied to all of other bit lines except the i-th bit line; and a voltage $V_{cc1}$ is applied to all of other gates of SG1s in the j-th column of the MTP flash memory cell unit. Under such programming operation conditions, the difference between the voltage 0V-VPP applied to the control gates of the FG1s in the j-th column of the MTP flash memory cell units except the control gate of the FG1 in the i-th row and the voltage $V_{cc2}$ applied to all of the drains of the FG1s in the j-th column of the MTP flash memory cell units except the control gate of the FG1 in the i-th row of the embodiment of the present disclosure is reduced comparing to that of the prior art, thereby reducing program disturb of all of the FG1s in the j-th column of the MTP flash memory cell units except the FG1 in the i-row of the MTP flash memory cell unit.

In one embodiment, the voltage Vcc2 is applied to the SG2 in the i-th row and the j-th column of the MTP flash memory cell unit, so that the SG2 is not conducting, i.e., turned off.

In one embodiment, the voltage Vcc2 is applied to all of the bit lines except the bit line in the i-th row; and the voltage Vcc2 is applied to all of other gates of the SG2s in the j-th column of the MTP flash memory cell units except to the gate of the SG2 in the i-th row of the MTP flash memory cell unit. Under these programming operation conditions, all of the SG2s in the j-th column of the MTP flash memory cell units except the SG2 in the i-row are not conducting (i.e., turned off), and the difference between the voltage 0V-VPP applied to the control gates of the FG2 and the voltage Vcc2 applied to the drains of the FG2 is reduced as compared with the difference (0V-VPP and −Vcc2) of that of the prior art, thereby reducing program disturb of all of the FG2s in the j-column except the FG2 in the i-th row of the MTP flash memory cell unit.

In one embodiment, the voltage Vcc2 is applied to the gates of all of the SG1 and SG2 in i-th row except the ones in the j-th column of the MTP flash memory cell units; and the voltage 0V is applied to all of the word lines except the word line in the j-th column.

In one embodiment, the voltage Vcc2 is applied to all of the bit lines except the bit line in the i-th row; the voltage Vcc2 is applied to the gates of all of SG1s and SG2s except the gate of SG1 and SG2 in the i-th row and j-th column; and the voltage 0 V is applied to all of the word lines except the word line in the j-th column. Under these programming operation conditions, all of the SG1s and SG2s except the SG1 and SG2 in the i-th row and the j-column are turned off, the difference between the voltage 0V applied to the control gates of FG1 and FG2 and the voltage Vcc2 applied to the drains of FG1 and FG2 is negative. In contrast, the difference (0V and −Vcc2) of conventional MTP flash memory cell units is positive. Therefore, the MTP flash memory cell units according to the embodiment of the present disclosure have reduced program disturb.

The conditions (referred to as the second programming operation conditions) for programming the FG2 in the i-th row and j-th column of the MTP flash memory cell unit are as follows:

(1') applying a voltage −Vcc2 to the i-th bit line;
(2') applying a voltage Vcc1 to the gate of the SG2 in the i-th row and j-th column of the MTP flash memory cell unit;
(3') applying a voltage 0V-VPP to the j-th word line;
(4') applying a voltage Vcc2 to the common source line and to the substrate, where $0 v<Vcc1<vcc2<VPP$.

In one embodiment, VPP≤6V. In one embodiment, the voltage applied to the j-th word line increases gradually from 0V to VPP1 (VPP1≤VPP), which can improve the programming success rate. For example, the voltage applied to the j-th word line increases 1V per 1 microsecond, which gradually increases from 0V to a voltage VPP1 (e.g., 3V) which is less than VPP, or gradually increases to VPP (e.g., 6V).

Through the above-described second programming operation conditions, the SG2 in the i-th row and the j-th column of the MTP flash memory cell unit is turned on, hot electrons under the FG2 are injected to the floating gate of the FG2 under the action of an electric field to realize the programming of the FG2 in the i-th row and j-th column of the MTP flash memory cell unit. For other FG1s and FG2s that are not to be programmed, the above-described second programming operation conditions can be controlled by additional programming operation conditions that will be described in detail below.

In one embodiment, the voltage Vcc2 is applied to other bit lines except the i-th bit line, and the voltage Vcc1 is applied to the gates of the FG2s in the j-th column other than the gate of the FG2 in the i-th row of the MTP flash memory cell unit. Under such programming operation conditions, the difference between the voltage 0V-VPP applied to the control gates of the FG2 in the other FG2 other than the control gate of the FG2 in the i-th row and the voltage applied to the drain is reduced as compared with the difference (0V-VPP and −Vcc2) of the conventional MTP flash memory cell units, thereby reducing program disturb of all of other FG2s in the j-th column except the FG2 in the i-th row.

In one embodiment, the voltage Vcc2 is applied to the gate of SG1 in the i-th row and j-th column of the MTP flash memory cell unit to turn off SG1.

In one embodiment, the voltage Vcc2 is applied to the other bit lines except the i-th bit line, and the voltage Vcc2 is applied to the gates of the SG1s in the j-th column except the gate of the SG1 in the i-th row of the MTP flash memory cell unit. Under such programming operation conditions, all of the SG1s except the SG1 in the i-th row are turned off. The difference between the voltage 0V-VPP applied to the control gates of the FG1 other than the control gates of the FG1 in the j-th column and the voltage Vcc2 applied to the drain is reduced as compared with the difference (0V-VPP and −Vcc2) of conventional MTP flash memory cell units, thereby reducing program disturb of all of other FG2s in the j-th column except the FG2 in the i-th row.

In one embodiment, the voltage Vcc2 is applied to the gates of SG1 and SG2 in the i-th row except the SG1 and SG2 in the j-th column of the MTP flash memory cell unit; and the voltage 0V is applied to all of the word lines except the word line in the j-th column.

In one embodiment, the voltage Vcc2 is applied to all of the bit lines except the bit line in the i-th row; the voltage Vcc2 is applied to the gates of SG1 and SG2 except the gates of the SG1 and SG2 in the i-th row and j-th column; the voltage 0V is applied to all of the word lines except the word line in the j-th column. Under such programming operation conditions, all of the SG1 and SG2 except the SG1 and SG2 in the i-th row and j-th column are turned off, the difference between the voltage 0V applied to the control gates of FG1 and FG2 and the voltage Vcc2 applied to the drain is negative, and the difference (0V and −Vcc2) of current MTP flash memory cell units is positive. Therefore, the MTP flash memory cell unit of the embodiment of the present disclosure has reduced programming disturb with respect to the conventional MTP flash memory cell units of the prior art.

The above description of the present disclosure thus provides a variety of different embodiments of MTP flash memory cell arrays.

The present disclosure also provide a semiconductor memory device that includes a plurality of MTP flash memory cell arrays as described in any one of the above-described embodiments.

Embodiments of the present disclosure also provide methods of operating the above-described MTP programmable cell arrays. In an embodiment of a method of operation, the method may include programming the FG1 in the i-th row and j-th column of an MTP flash memory cell unit (referred to as the first programming operation):

(1) applying a voltage −Vcc2 to an i-th bit line;
(2) applying a voltage Vcc1 to the gate of a SG1 in an i-th row and j-th column of the MTP flash memory cell unit;

(3) applying a voltage 0V-VPP to a j-th word line;

(4) applying the voltage Vcc2 to the common source line and to the substrate; where 0V<Vcc1<Vcc2<VPP.

In one embodiment, VPP≤6V. In one specific embodiment, the voltage applied to the j-th word line gradually increases from 0V to VPP1 (VPP1≤VPP) to improve the programming success rate. For example, the voltage applied to the j-th word line increases 1V per microsecond, which gradually increases from 0V to the voltage VPP1 that is less than VPP, e.g., 3V, or to VPP, e.g., 6V.

According to the first programming operation method of the present disclosure, the SG1s in the j-th column of the MTP flash memory cell unit are turned on, hot electrons under the FG1 are injected into the floating-gate of the FG1 under the action of the electric field to program the FG1 in the i-th row and j-th column of the MTP flash memory cell unit.

In one embodiment, in addition to the above-described first programming operation, the operating method may further include applying a voltage Vcc2 to all of the bit lines except the i-th bit line, and applying a voltage Vcc1 to the gates of the SG1s in the j-th column except the gate of SG1 in the i-th row of the MTP flash memory cell unit. In the embodiment, the difference between the voltage 0V-VPP applied to the control gates of the FG1s in the j-column except the control gate of the FG1 in the i-th row and the voltage Vcc2 applied to the drains of the FG1s in the j-column is reduced compared with the voltage difference (0V-VPP and -Vcc2) of those of the prior art. Therefore, program disturb is reduced in the FG1s in the j-th column except the FG1 in the i-th row of the MTP flash memory cell unit.

In one embodiment, in addition to the above-described first programming operation, the operating method may also include applying the voltage Vcc2 to the gate of the SG2 in the i-th row and j-th column of the MTP flash memory cell unit to turn off the SG2.

In one embodiment, in addition to the above-described first programming operation, the operating method may also include applying the voltage Vcc2 to the bit lines except the i-th bit line, and applying the voltage Vcc2 to the gates of the SG2s except the gate of the SG2 in the i-th row and j-th column of the MTP flash memory cell unit. In the embodiment, all of the SG2s in the j-th column except the SG2 in the i-th row are turned off, and the difference between the voltage 0V-VPP applied to the control gates and the voltage Vcc2 applied to the drains of the FG2s is reduced compared with the difference (0V-VPP and -Vcc2) of those of the prior art, so that program disturb is reduced in the FG2s in the j-th column except the FG2 in the i-th row of the MTP flash memory cell unit.

In one embodiment, in addition to the above-described first programming operation, the operating method may also include applying the voltage Vcc2 to the gates of the SG1 and SG2 in the i-th row except to the gates of the SG1 and SG2 in the j-th column, and applying the voltage 0V to all of the word lines except the j-th word line.

In one embodiment, in addition to the above-described first programming operation conditions, the operating method may also include applying the voltage Vcc2 to all of the bit lines except the i-th bit line, applying the voltage Vcc2 to the gates of the SG1s and SG2s except the SG1 and SG2 in the j-th column, and applying the voltage 0V to the word lines except the j-th word line. In the embodiment, the SG1s and SG2s except the SG1 and SG2 in the i-th row and j-th column are turned off, the difference between the voltage 0V applied to the control gates of the FG1s and FG2s and the voltage Vcc2 applied to the drains of the FG1s and FG2s are negative. In contrast, the difference (0 and -Vcc2) of those of the prior art is positive, therefore, program disturb in the FG1s and FG2s of the MTP flash memory cell units of the present disclosure is reduced.

Embodiments of the present disclosure also provide another method for operating the above-described MTP programmable cell arrays. The method may include programming the FG2 in the i-th row and j-th column of an MTP flash memory cell unit (referred to as the second programming operation):

(1') applying a voltage -Vcc2 to an i-th bit line;

(2') applying a voltage Vcc1 to a gate of a SG2 in an i-th row and j-th column of the MTP flash memory cell unit;

(3') applying a voltage 0V-VPP to a j-th word line;

(4') applying a voltage Vcc2 to the common source line and to the substrate; where 0V<Vcc1<Vcc2<VPP.

In one embodiment, VPP≤6V. In one specific embodiment, the voltage 0V-VPP applied to the j-th word line gradually increases from 0V to VPP1 (VPP1≤VPP) to improve the programming success rate. For example, the voltage 0V-VPP applied to the j-th word line increases 1V per microsecond, which gradually increases from 0V to the voltage VPP1 that is less than VPP, e.g., 3V, or to VPP, e.g., 6V.

According to the second programming operation of the present disclosure, the SG2 in the j-th column of the MTP flash memory cell unit is turned on, hot electrons under the FG2 are injected into the floating-gate of the FG2 under the action of the electric field to program the FG2 in the i-th row and j-th column of the MTP flash memory cell unit.

In one embodiment, in addition to the above-described second programming operation, the operating method may further include applying a voltage Vcc2 to all of the bit lines except the i-th bit line, and applying a voltage Vcc1 to the gates of the SG2s in the j-th column except the gate of SG2 in the i-th row of the MTP flash memory cell unit. In the embodiment, the difference between the voltage 0V-VPP applied to the control gates of the FG2s in the j-column except the control gate of the FG2 in the i-th row and the voltage Vcc2 applied to the drains of the FG2s in the j-column is reduced compared with the difference (0V-VPP and -Vcc2) of those of the prior art. Therefore, program disturb is reduced in the FG2s in the j-th column except the FG2 in the i-th row of the MTP flash memory cell unit.

In one embodiment, in addition to the above-described second programming operation, the operating method may also include applying the voltage Vcc2 to the gate of the SG1 in the i-th row and j-th column of the MTP flash memory cell unit to turn off the SG1.

In one embodiment, in addition to the above-described second programming operation, the operating method may also include applying the voltage Vcc2 to all other bit lines except the i-th bit line, and applying the voltage Vcc2 to the gates of the SG1s except the gate of the SG1 in the i-th row and j-th column of the MTP flash memory cell unit. In the embodiment, all of the SG1s in the j-th column except the SG1 in the i-th row are turned off, and the difference between the voltage 0V-VPP applied to the control gates and the voltage Vcc2 applied to the drains of the FG1s is reduced compared with the difference (0V-VPP and -Vcc2) of those of the prior art, so that program disturb is reduced in the FG1s in the j-th column except the FG1 in the i-th row of the MTP flash memory cell unit.

In one embodiment, in addition to the above-described second programming operation, the operating method may also include applying the voltage Vcc2 to the gates of the SG1s and SG2s in the i-th row except the SG1s and SG2s in the j-th column, and applying the voltage 0V to all other word lines except the j-th word line.

In one embodiment, in addition to the above-described second programming operation, the operating method may also include applying the voltage Vcc2 to all other bit lines except the i-th bit line, applying the voltage Vcc2 to the gates of the SG1s and SG2s except the gates of the SG1s and SG2s in the j-th column, and applying the voltage 0V to the word lines except the j-th word line. In the embodiment, the SG1s and SG2s except the SG1s and SG2s in the i-th row and j-th column are turned off, the difference between the voltage 0V applied to the control gates of the FG1s and FG2s and the voltage Vcc2 applied to the drains of the FG1s and FG2s are negative. In contrast, the voltage difference (0 and –Vcc2) of those of the prior art is positive, therefore, program disturb in the FG1s and FG2s of the MTP flash memory cell unit of the present disclosure is reduced.

Figure 7:
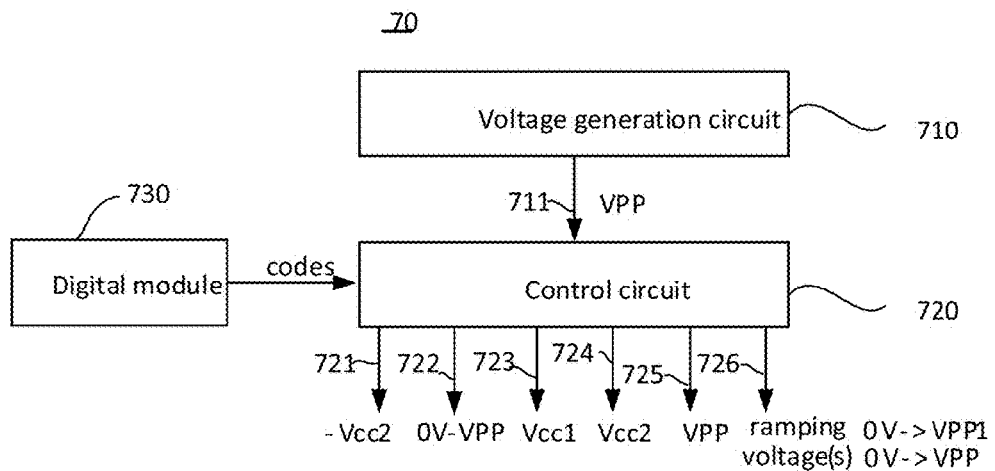
FIG. 7 is a voltage control circuit configured to generate multiple voltages for the programming operation of the MTP flash memory cell units according to an embodiment of the present disclosure.

FIG. 7 is a voltage control circuit 70 configured to generate multiple voltages for the operation of the MTP flash memory cell units according to an embodiment of the present disclosure. Referring to FIG. 7, voltage generation circuit 70 may include a voltage generation circuit 710 configured to generate a high voltage VPP 711. In some embodiments, High voltage Vpp may be about 6V. The voltage generation circuit may also include a control circuit 720 configured to generate different output voltages, such a voltage (–Vcc2) 721, a voltage (0V-VPP) 722, a voltage (Vcc1) 723, a voltage (Vcc2) 724, a voltage (VPP) 725, and a ramping voltage (0V-VPP1) 726. In one example embodiment, control circuit 720 may include a voltage divider configured to generate the voltage Vcc1 and the voltage Vcc2 from the high voltage VPP. Control circuit 720 may also include an inverting buffer to generate the voltage (–Vcc2) from the respective voltage Vcc2. Control circuit 720 may further include a voltage integrator to generate a dynamic ramping voltage, e.g., a dynamic ramping voltage from 0V to Vcc1, a dynamic ramping voltage from 0V to Vcc2, and a dynamic ramping voltage from 0V to VPP1 (or to VPP) at a rate of 1V per microsecond (1V/µs). Voltage generation circuit 70 may include a digital module 730 configure to provide codes to control circuit 720 for generating the different voltages (e.g., –Vcc2, Vcc1, Vccc2, VPP, and the ramping voltages) in response to the codes. In some embodiments, digital module 730 may be integrated with the MTP flash memory array on a same integrated circuit. In some other embodiments, digital module 730 may be a digital circuit outside of the MTP flash memory array. Digital module 730 may be an application specific integrated circuit (ASIC), a field programmable gate array (FPGA), a microcontroller, or a processor for executing instructions to provide codes to control circuit 720.

Figure 8:
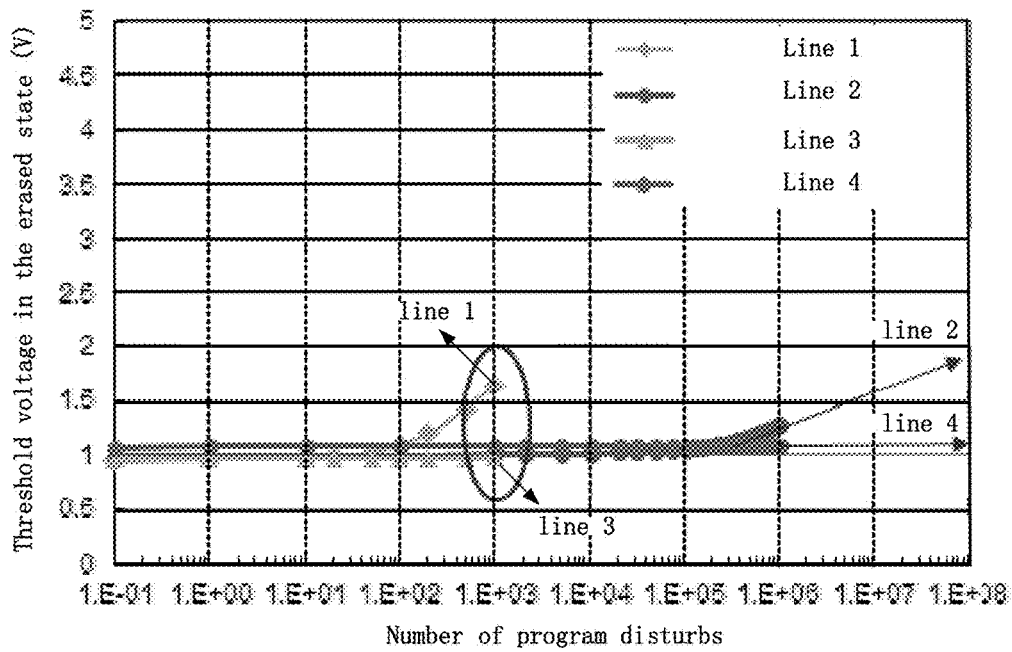
FIG. 8 is a graph illustrating the relationship between the number of program disturbs and the threshold voltages in an erased state.

FIG. 8 is a graph illustrating the relationship between the number of program disturbs and the threshold voltage in an erased state. The x-axis represents the number of program disturbs, and the y-axis represents the threshold voltage in the erased state. The graph includes line 1, line 2, line 3, and line 4. Line 1 represents the relationship between the number of program disturbs and the threshold voltage in the erased state according to a conventional MTP flash memory cell unit of the prior art. Line 3 represents the relationship between the number of program disturbs and the threshold voltage in the erased state of an MTP flash memory cell unit according to an embodiment of the present disclosure. The number of program disturbs of the other FG1s or FG2s in the j-th column except the FG1 or FG2 in the i-th row is taken relative to the threshold voltage in the erased state while programming the FG1 or FG2 in the j-th column. Similarly, line 2 and line 4 represents the relationship between the number of program disturbs and the threshold voltage in the erased state of conventional MTP flash memory cell units of the prior art and according to the present disclosure, respectively. Data are taken for the other FG1s or FG2s except the FG1 or FG2 in the i-th row and j-th column while programming the FG1 or FG2 in the i-th row and j-th column of a MTP flash memory unit.

Herein, the number of program disturbs is the number of program disturbs of the FG1 or FG2 that are not expected to be programmed. The number of program disturbs is the same as the number of programming times of the FG1 or FG2 that is expected to be programmed. In the case of a predetermined number of program disturbs, a small variation in the threshold voltage variation of the floating-gate transistor indicates small program disturbs. As can be seen in FIG. 7, in the case where the number of program disturbs is 1000, the change of the threshold voltage of the line 3 (i.e., present disclosure) is significantly smaller than that of the line 1 (prior art). Thus, the present disclosure reduces program disturbs of the FG1 and FG2 in the j-th column except the FG1 and FG2 in the i-th row of an MTP flash memory cell unit with respect to those in the prior art. In addition, in the case where the number of program disturbs is 1,000,000 (1.E+06), the change in the threshold voltage of the line 4 (present disclosure) is significantly smaller than that of the line 2 (prior art). Thus, the present disclosure also reduces program disturbs of the FG1s and FG2s in other MTP flash memory cell units other than the one in the i-th row and j-th column.

In summary, embodiments of the present disclosure provide a novel MTP flash memory cell unit, an array of multiple MTP flash memory cell units, a memory device including the array of MTP flash memory cell units, and methods for operating the same.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

What is claimed is:

1. A multiple-time programmable (MTP) flash memory cell array comprising m×n MTP flash memory cell units, m and n being integer, m≥1, and n≥1, each of the MTP flash memory cell units comprising:

a first select transistor, a second select transistor, a first floating-gate transistor, and a second floating-gate transistor on a substrate, wherein:

the first floating-gate transistor has a source connected to a drain of the first select transistor, and a drain connected to a drain of the second floating-gate transistor;

the second floating transistor has a source connected to a drain of the second select transistor;

the MTP flash memory cell array comprising:

the first floating-gate transistor and the second floating-gate transistor of an MTP flash memory cell unit in a j-th column each having a control gate connected to a j-th word line, wherein 1≤j≤m;

the first select transistor and the second select transistor of each of the MTP flash memory cell units in the j-th column each having a source connected to a common source line;

the first floating-gate transistor and the second floating-gate transistor of an MTP flash memory cell unit in an i-th row each having a drain connected to an i-th bit line, wherein 1≤i≤n.

2. The MTP flash memory cell array of claim 1, wherein each of the MTP flash memory cell units comprises:

the first floating-gate transistor has a control gate and a floating gate below the control gate, the control gate and the floating-gate of the first floating-gate transistor being not aligned with each other;

the second floating-gate transistor has a control gate and a floating gate below the control gate, the control gate and the floating gate of the second floating-gate transistor being not aligned with each other.

3. The MTP flash memory cell array of claim 1, further comprising a control circuit configured to provide programming operation conditions to the first floating-gate transistor of an MTP flash memory cell unit in the i-th row and j-th column of the MTP flash memory cell array, the control circuit is further configured to apply:

a voltage −Vcc2 to the i-th bit line;

a voltage Vcc1 to a gate of the first select transistor of the MTP flash memory cell unit in the i-th row and j-th column of the MTP flash memory cell array;

a voltage 0V-VPP to the j-th word line; and a voltage Vcc2 to the common source line and the substrate, wherein 0V<Vcc1<Vcc2<VPP.

4. The MTP flash memory cell array of claim 3, wherein the control circuit is further configured to apply:

the voltage Vcc2 to other bit lines except the i-th bit line;

the voltage Vcc1 to gates of the first select transistors in the j-th column of MTP flash memory cell units.

5. The MTP flash memory cell array of claim 3, wherein the control circuit is further configured to apply:

the voltage Vcc2 to a gate of the second select transistor in the i-th row and j-th column of an MTP flash memory cell unit.

6. The MTP flash memory cell array of claim 3, wherein the control circuit is further configured to apply:

the voltage Vcc2 to other bit lines except the i-th bit line;

the voltage Vcc2 to gates of the second select transistors in the j-th column of MTP flash memory cell units except a gate of the second select transistor in the i-th row.

7. The MTP flash memory cell array of claim 1, further comprising a control circuit configured to provide programming operation conditions to the second floating-gate transistor of an MTP flash memory cell unit in the i-th row and j-th column of the MTP flash memory cell array, the control circuit is further configured to apply:

a voltage −Vcc2 to the ith-bit line;

a voltage Vcc1 to a gate of the second select transistor of the MTP flash memory cell unit in the i-th row and j-th column of the MTP flash memory cell array;

a voltage 0V-VPP to the j-th word line; and a voltage Vcc2 to the common source line and the substrate, wherein 0V<Vcc1<Vcc2<VPP.

8. The MTP flash memory cell array of claim 7, wherein the control circuit is further configured to apply:

the voltage Vcc2 to other bit lines except the i-th bit line;

the voltage Vcc1 to gates of the second select transistors in the j-th column of MTP flash memory cell units.

9. The MTP flash memory cell array of claim 7, wherein the control circuit is further configured to apply:

the voltage Vcc2 to a gate of the first select transistor in the i-th row and j-th column of an MTP flash memory cell unit.

10. The MTP flash memory cell array of claim 7, wherein the control circuit is further configured to apply:

the voltage Vcc2 to other bit lines except the i-th bit line;

the voltage Vcc2 to gates of the first select transistors in the j-th column of MTP flash memory cell units except a gate of the first select transistor in the i-th row.

11. The MTP flash memory cell array of claim 7, wherein the control circuit is further configured to apply:

the voltage Vcc2 to gates of the first select transistors and second select transistors in the i-th row of MTP flash memory unit cell units except a gate of the first select transistor and a gate of the second select transistor in the j-th column of MTP flash memory unit cells;

a voltage 0V to other word lines except the j-th word line.

12. The MTP flash memory cell array of claim 7, wherein the control circuit is further configured to apply:

the voltage Vcc2 to bit lines except the i-th bit line;

the voltage Vcc2 to gates of the first select transistors and the gates of the second select transistors of MTP flash memory cell units except a gate of the first select transistor and a gate of the second select transistor of the MTP flash memory cell unit in the i-th row and j-th column of the MTP flash memory cell array;

a voltage 0V to word lines except the j-th word line.

13. The MTP flash memory cell array of claim 7, wherein the control circuit is further configured to gradually increase the voltage 0V-VPP from 0V to a voltage VPP1, wherein VPP1≤VPP.

14. A memory device, comprising a multiple-time programmable (MTP) flash memory cell array of claim 1.

15. A method for operating a multiple-time programmable (MTP) flash memory cell array comprising m×n MTP flash memory cell units, m and n being integer, m≥1, and n≥1, each of the MTP flash memory cell unit comprising a first select transistor, a second select transistor, a first floating-gate transistor, and a second floating-gate transistor on a substrate, wherein the first floating-gate transistor has a source connected to a drain of the first select transistor, and a drain connected to a drain of the second floating-gate transistor, the second floating-gate transistor has a source connected a drain of the second select transistor, the MTP flash memory cell array comprising the first floating-gate transistor and the second floating-gate transistor of an MTP flash memory cell in a j-th column each having a control gate connected to a j-th word line, 1≤j≤m, the first select transistor and the second select transistor of the MTP flash memory cell unit in the j-th column each having a source connected to a common source line, the first floating-gate transistor and the second floating-gate transistor of an MTP flash memory cell unit in an i-th row each having a drain connected to an i-th bit line, 1≤i≤n, the method comprising:

applying a voltage −Vcc2 to an i-th bit line;

applying a voltage Vcc1 to a gate of the first select transistor of the MTP flash memory cell unit in the i-th row and j-th column of the MTP flash memory cell array;

applying a voltage 0V-VPP to the j-th word line; and applying a voltage Vcc2 to the common source line and the substrate, wherein 0V<Vcc1<Vcc2<VPP.

16. The method of claim 15, further comprising:
applying the voltage Vcc2 to other bit lines except the i-th bit line;
applying the voltage Vcc1 to gates of the first select transistors in the j-th column of MTP flash memory cell units.

17. The method of claim 15, further comprising:
applying the voltage Vcc2 to a gate of the second select transistor in the i-th row and j-th column of an MTP flash memory cell unit.

18. The method of claim 15, further comprising:
applying the voltage Vcc2 to other bit lines except the i-th bit line;
applying the voltage Vcc2 to gates of the second select transistors in the j-th column of MTP flash memory cell units except a gate of the second select transistor in the i-th row.

19. The method of claim 15, further comprising:
applying the voltage Vcc2 to gates of the first select transistors and second select transistors in the i-th row of MTP flash memory unit cells except the gate of the first select transistor and the gate of the second select transistor in the j-th column of MTP flash memory unit cells;
applying a voltage 0V to other word lines except the j-th word line.

20. The method of claim 15, further comprising:
applying the voltage Vcc2 to other bit lines except the i-th bit line;
applying the voltage Vcc2 to gates of the first select transistors and the gates of the second select transistors of MTP flash memory cell units except a gate of the first select transistor and a gate of the second select transistor in the i-th row and j-th column of an MTP flash memory unit cell;
applying a voltage 0V to other word lines except the j-th word line.

21. The method of claim 15, wherein applying the voltage 0V-VPP to the j-th word line comprises:
gradually increasing the voltage 0V-VPP from 0V to a voltage VPP1, VPP1≤VPP.

* * * * *